(12) United States Patent
Behdjat et al.

(10) Patent No.: US 8,567,756 B2
(45) Date of Patent: Oct. 29, 2013

(54) SLIT VALVE DOOR ABLE TO COMPENSATE FOR CHAMBER DEFLECTION

(75) Inventors: Mehran Behdjat, San Jose, CA (US);
Shinichi Kurita, San Jose, CA (US);
John M. White, Hayward, CA (US);
Suhail Anwar, San Jose, CA (US);
Makoto Inagawa, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1012 days.

(21) Appl. No.: 12/548,553

(22) Filed: Aug. 27, 2009

(65) Prior Publication Data

US 2010/0050534 A1   Mar. 4, 2010

Related U.S. Application Data

(60) Provisional application No. 61/092,480, filed on Aug. 28, 2008.

(51) Int. Cl.
*F16K 25/00* (2006.01)

(52) U.S. Cl.
USPC .............................. 251/85; 251/193; 251/334

(58) Field of Classification Search
USPC ............... 251/77, 84–86, 158, 159, 167–169, 251/193–204, 333, 334; 414/217, 221, 935; 118/715, 719; 156/345.31, 345.32
See application file for complete search history.

(56) References Cited

U.S. PATENT DOCUMENTS

| | | | |
|---|---|---|---|
| 4,052,036 A * | 10/1977 | Schertler | ........................ 251/167 |
| 4,381,100 A | 4/1983 | Schoenberg | |
| 5,356,113 A | 10/1994 | Mizuishi et al. | |
| 6,390,448 B1 | 5/2002 | Kroeker et al. | |
| 6,601,824 B2 * | 8/2003 | Kroeker et al. | ............... 251/167 |
| 7,086,638 B2 * | 8/2006 | Kurita et al. | ................. 251/195 |
| 2005/0274923 A1 | 12/2005 | Tanase et al. | |
| 2005/0285992 A1 | 12/2005 | White et al. | |
| 2006/0028596 A1 | 2/2006 | Leung et al. | |
| 2006/0151735 A1 | 7/2006 | Lee et al. | |

FOREIGN PATENT DOCUMENTS

| | | |
|---|---|---|
| CN | 1788175 A | 6/2006 |
| JP | 61-124778 A | 6/1986 |
| JP | 63-254275 A | 10/1988 |
| JP | 05-215275 A | 8/1993 |
| JP | 2006-005348 A | 1/2006 |

OTHER PUBLICATIONS

International Search Report and Written Opinion for PCT/US2009/055206 dated Apr. 1, 2010.

(Continued)

*Primary Examiner* — Eric Keasel
(74) *Attorney, Agent, or Firm* — Pattterson & Sheridan, LLP

(57) ABSTRACT

Embodiments disclosed herein generally relate to a slit valve door assembly for sealing an opening in a chamber. A slit valve door that is pressed against the chamber to seal the slit valve opening moves with the chamber as the slit valve opening shrinks so that an o-ring pressed between the slit valve door and the chamber may move with the slit valve door and the chamber. Thus, less rubbing of the o-ring against the chamber may occur. With less rubbing, fewer particles may be generated and the o-ring lifetime may be extended. With a longer lifetime for the o-ring, substrate throughput may be increased.

6 Claims, 14 Drawing Sheets

(56) References Cited

OTHER PUBLICATIONS

Office Action for Chinese Patent Application No. 200980134015.4 dated Nov. 22, 2012.

Office action for Japanese Patent Application No. 2011-525196 dated Jun. 25, 2013.

Office action for Chinese Patent Application No. 200980134015.4 dated Jul. 15, 2013.

* cited by examiner

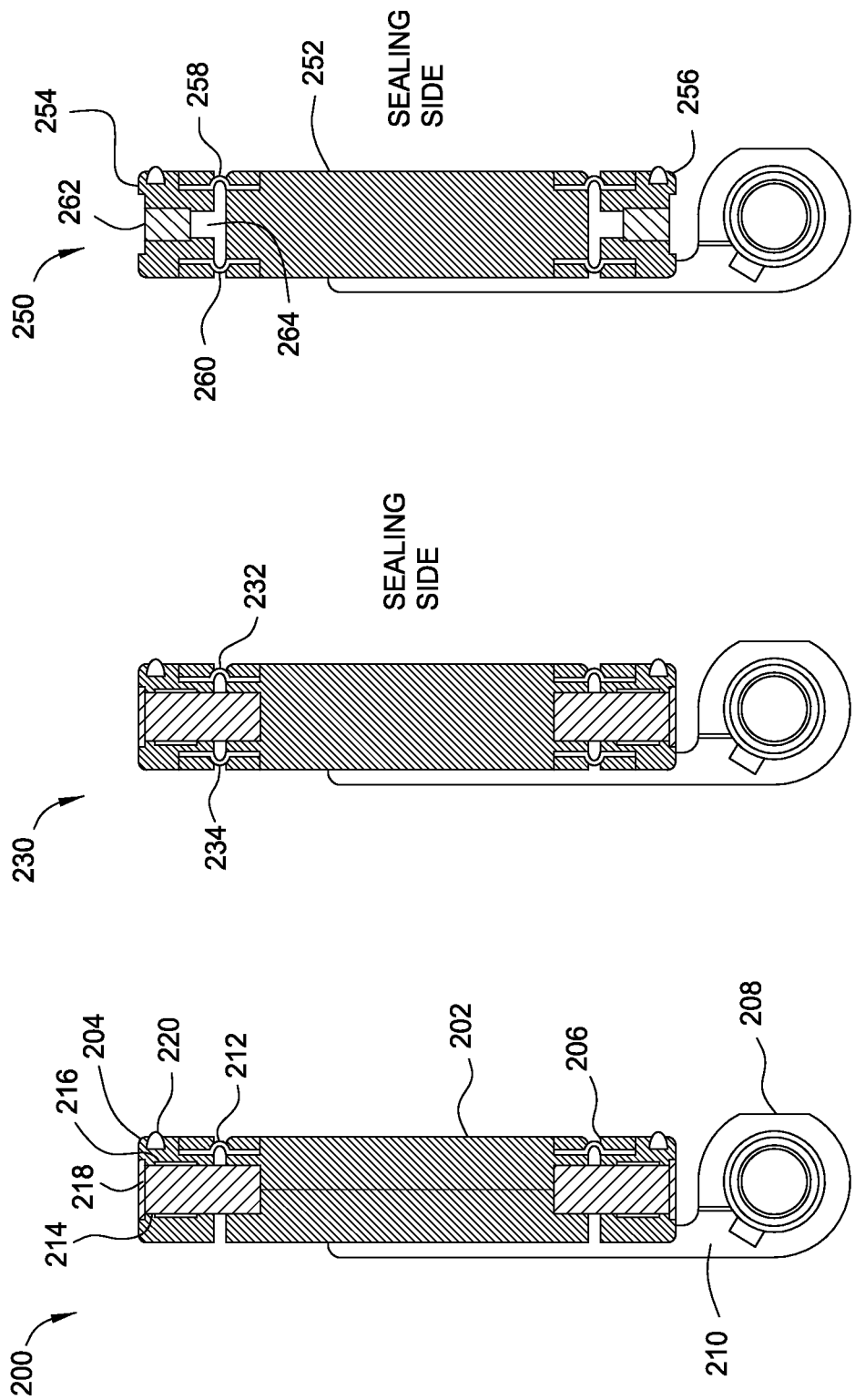

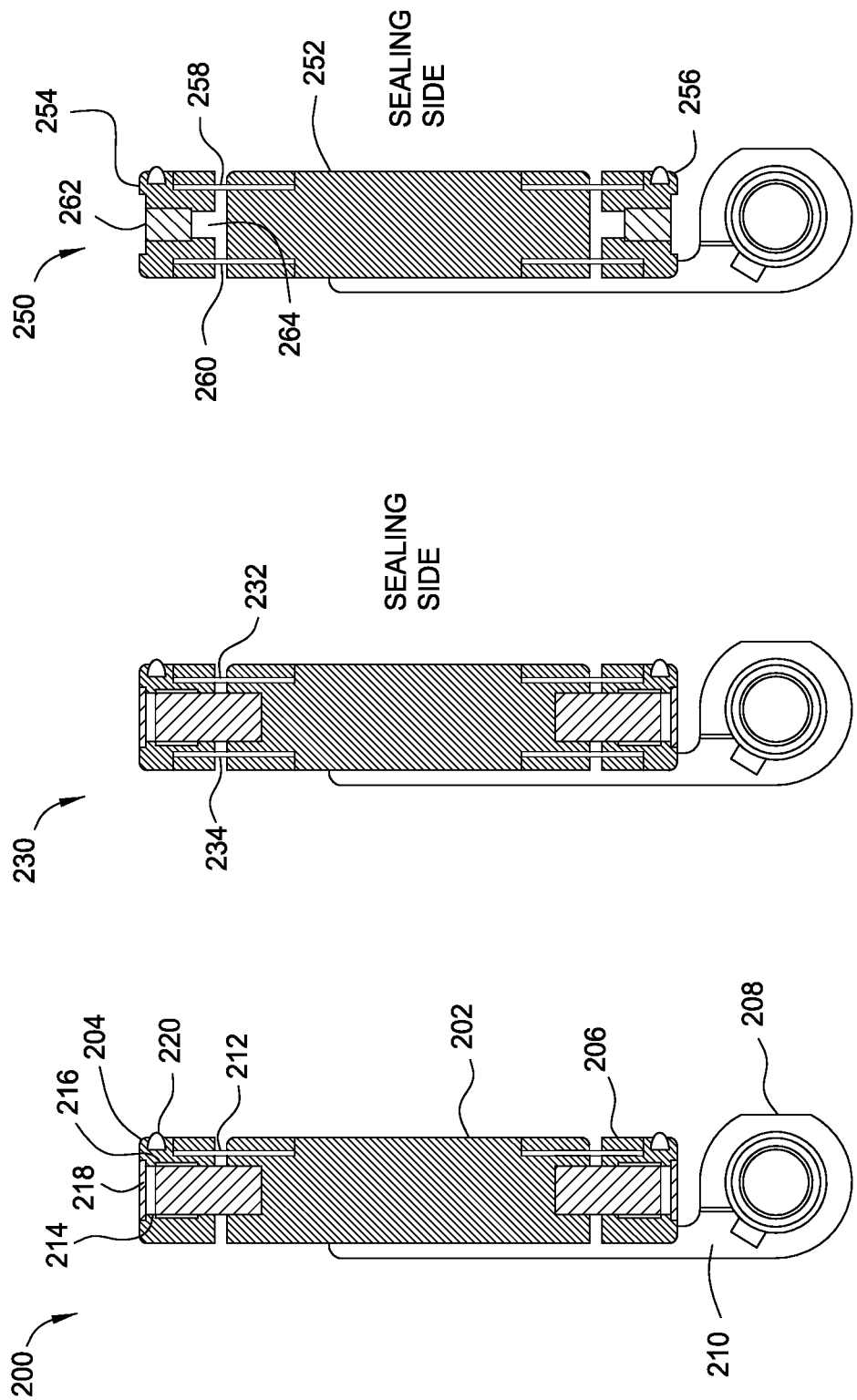

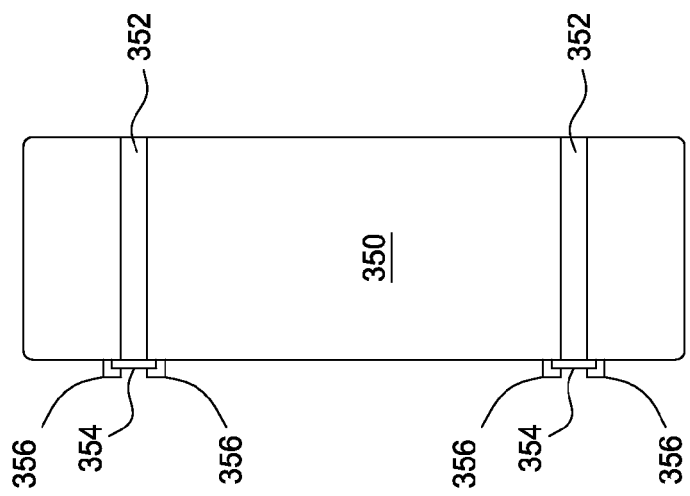
FIG. 3C
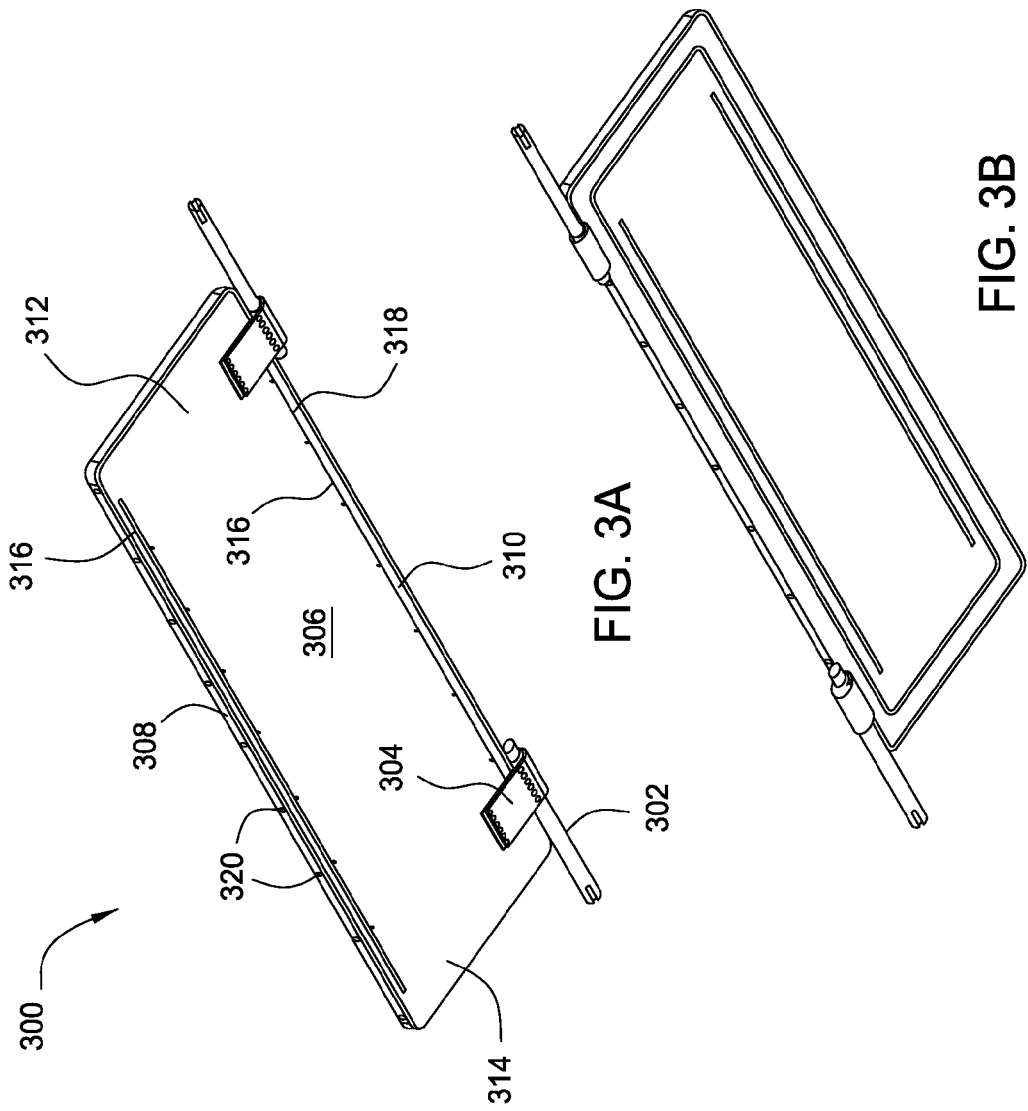
FIG. 3A
FIG. 3B

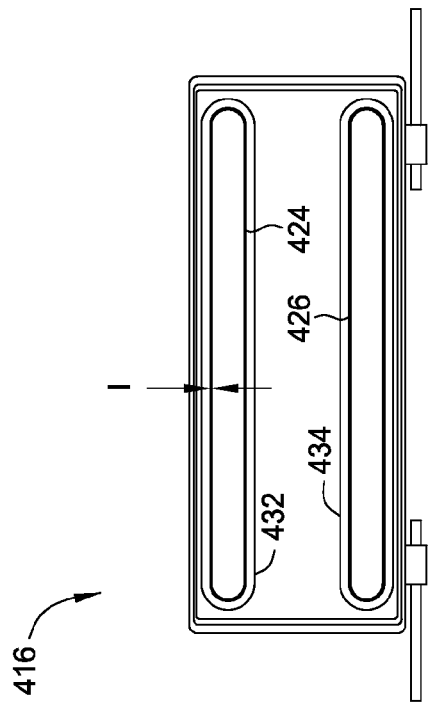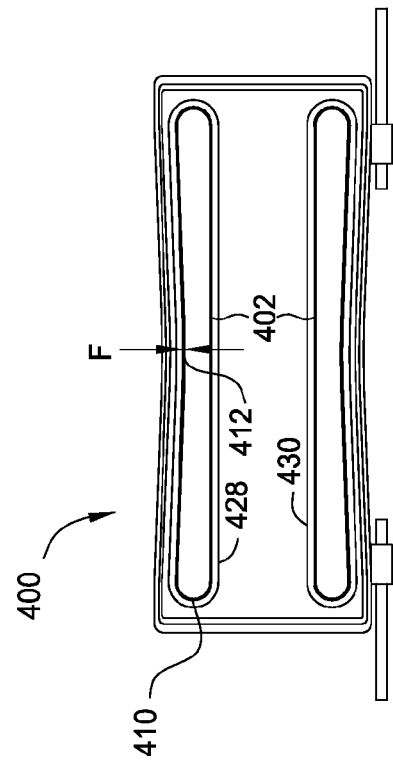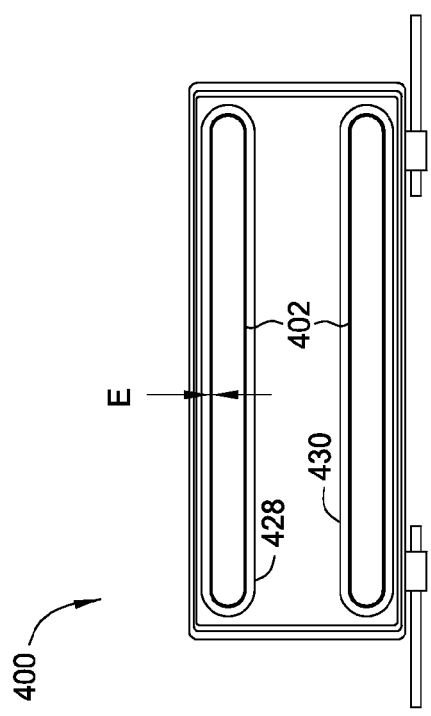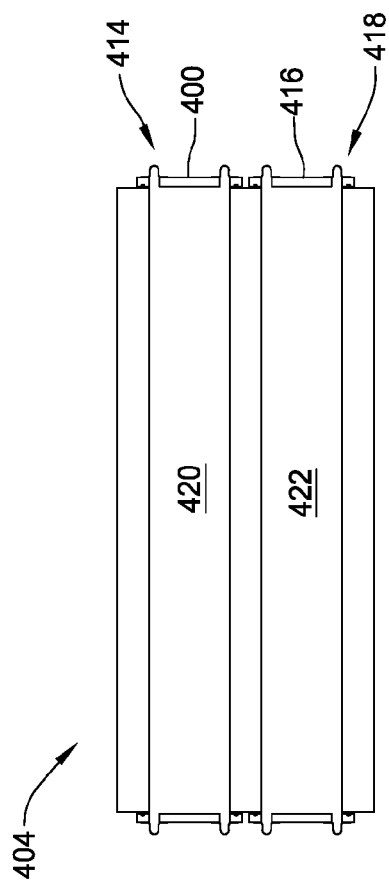

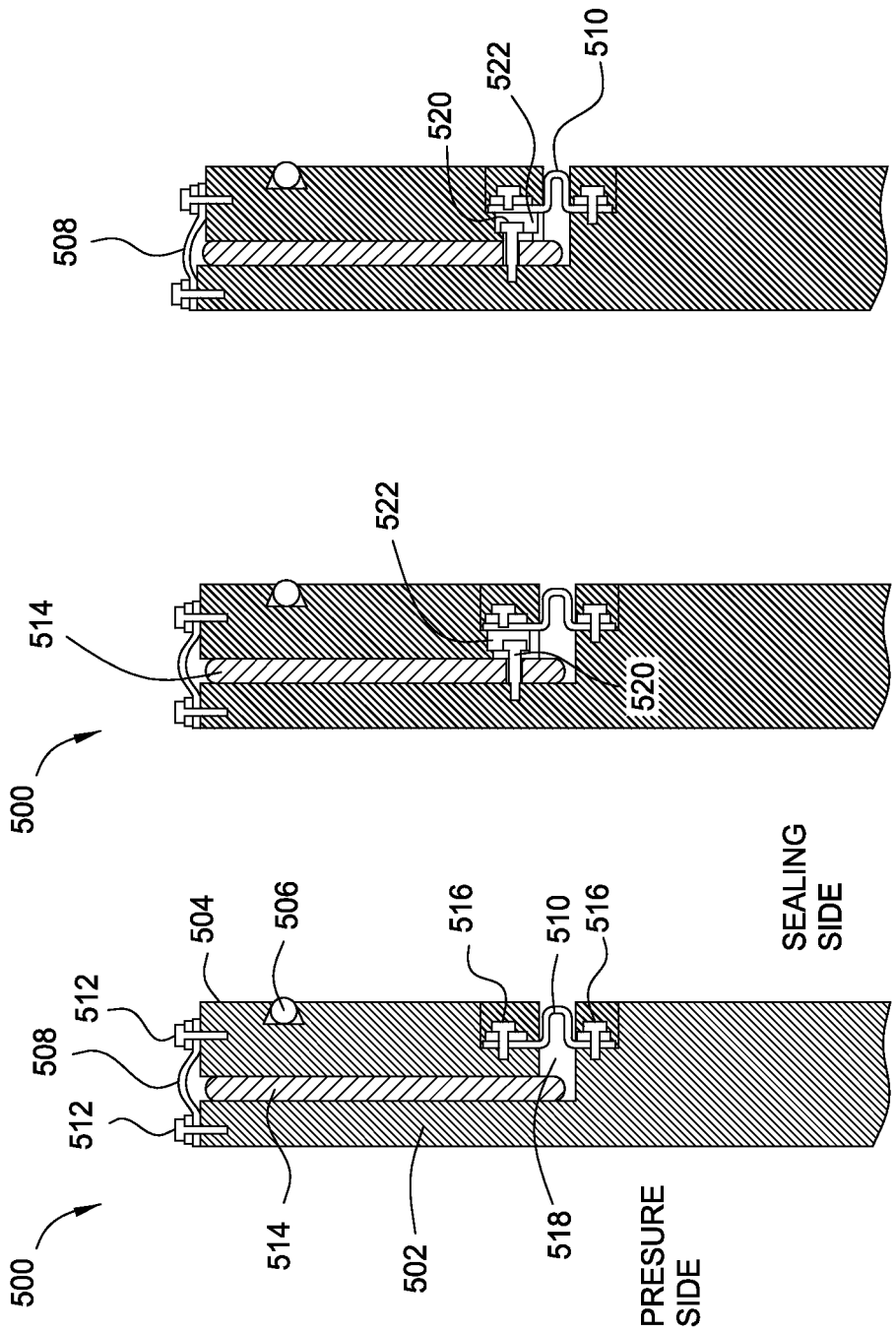

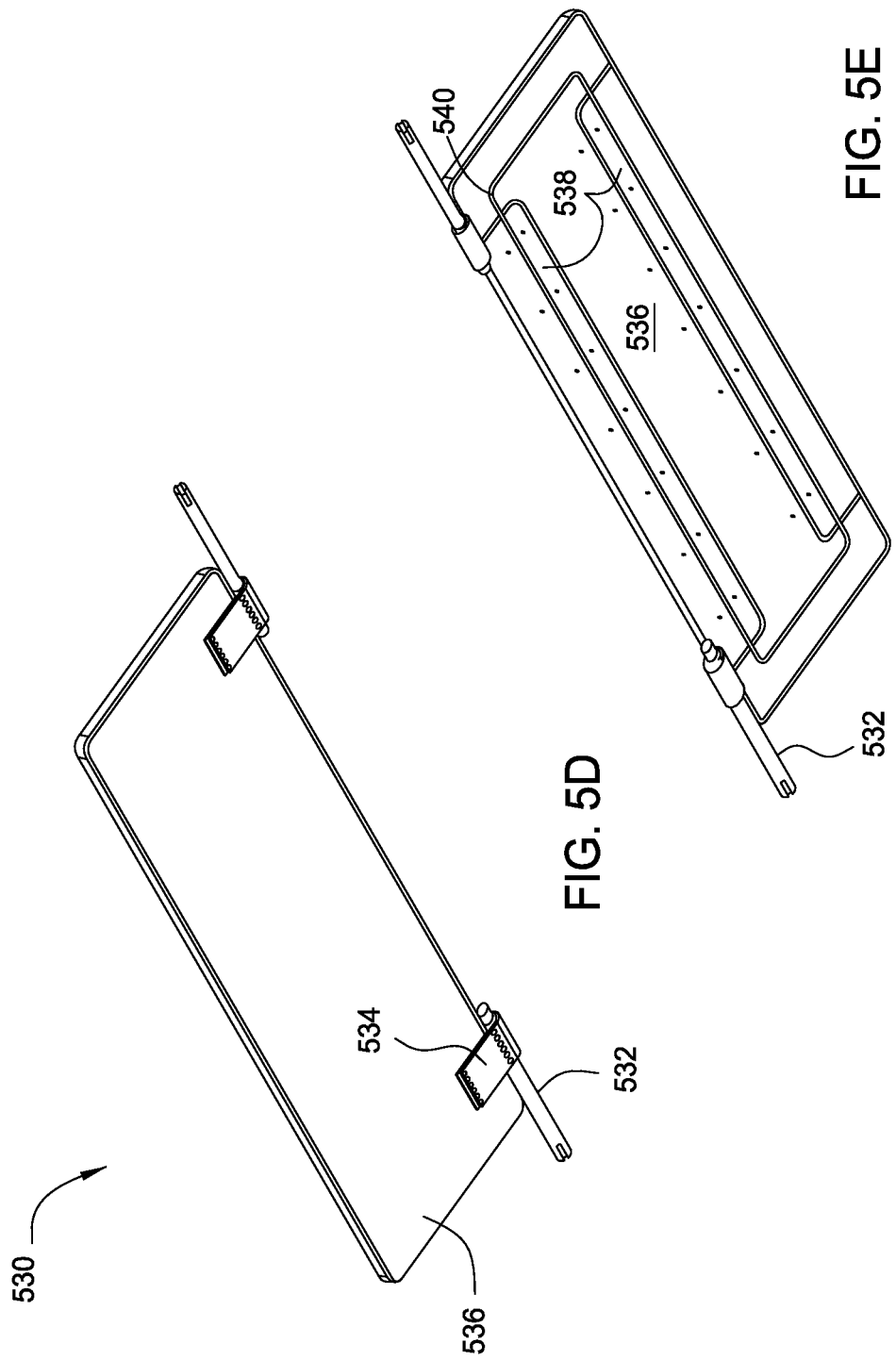

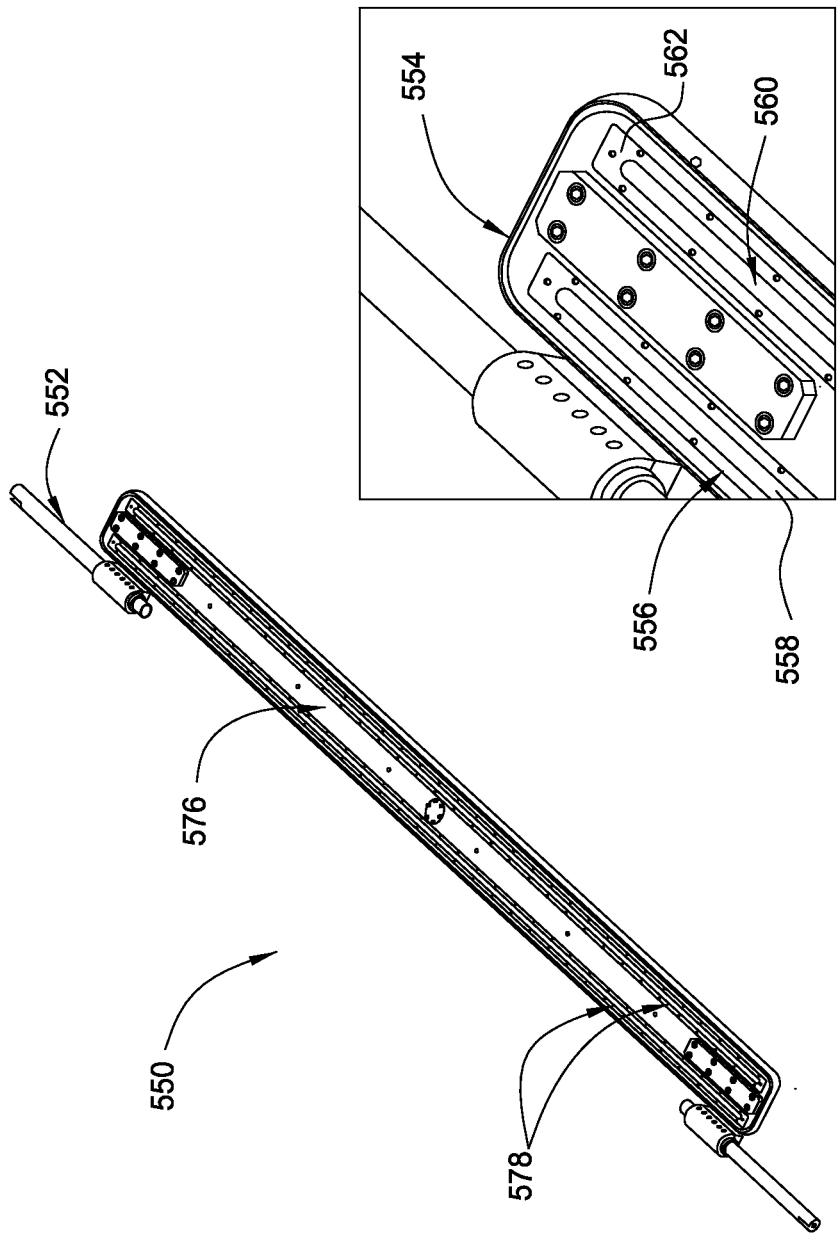

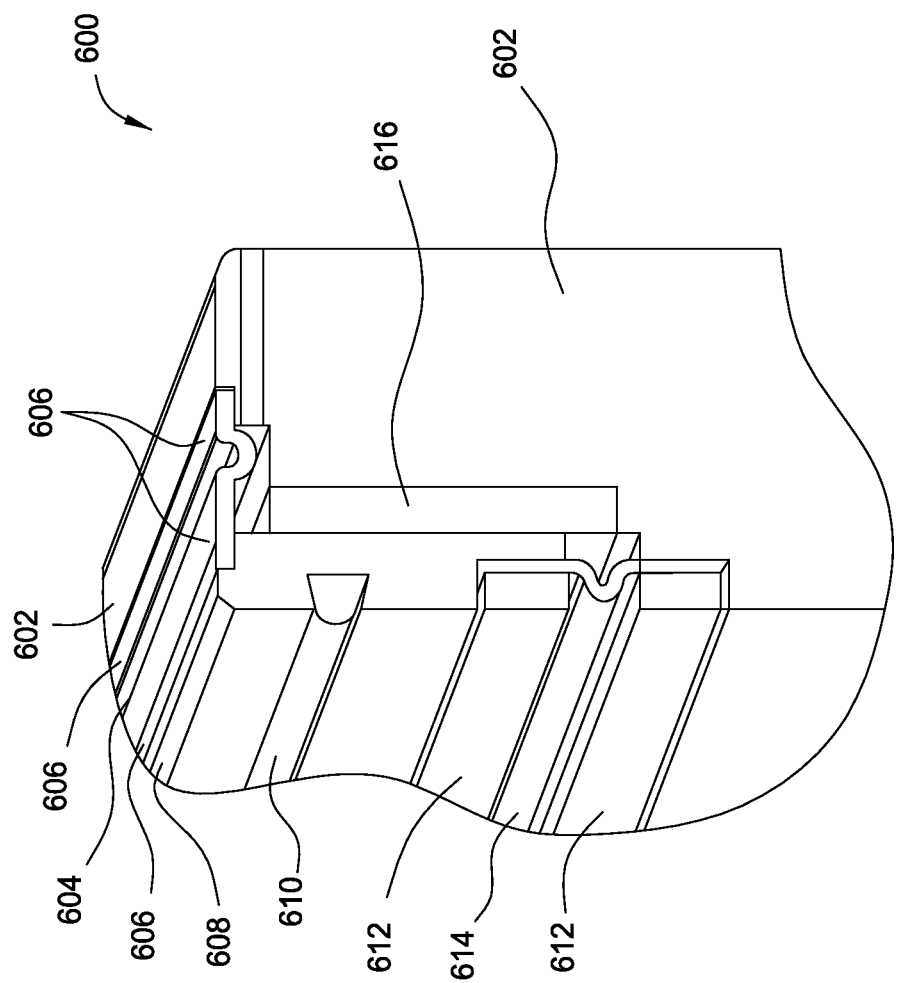

SLIT VALVE DOOR ABLE TO COMPENSATE FOR CHAMBER DEFLECTION

CROSS-REFERENCE TO RELATED APPLICATIONS

This application claims benefit of U.S. Provisional Patent Application Ser. No. 61/092,480 (APPM/13375L), filed Aug. 28, 2008, which is herein incorporated by reference.

BACKGROUND OF THE INVENTION

1. Field of the Invention

Embodiments disclosed herein generally relate to a slit valve door for sealing an opening in a chamber.

2. Description of the Related Art

In order to introduce a substrate to a chamber, a door is typically opened and the substrate is inserted thorough an opening into the interior volume of the chamber. The door is then closed and a vacuum is drawn. As the vacuum is drawn, the chamber may compress in on itself and hence, the opening may shrink due to the chamber movement. When the chamber is vented, the chamber may return to its normal state.

The door, when sealed to the chamber, may remain stationary because it is not a part of the chamber wall. The sealing mechanism, typically an o-ring, is compressed between the door and the chamber wall. Thus, the chamber, as it compresses or vents, moves relative to the door and o-ring and rubs against the o-ring and potentially the door. Because the chamber rubs against the o-ring, the o-ring may break and the seal may be broken to compromise the vacuum integrity of the chamber. Additionally, particles may be generated due to the rubbing.

Therefore, there is a need in the art for a chamber and door arrangement that prevents the generation of particles while maintaining vacuum integrity.

SUMMARY OF THE INVENTION

Embodiments disclosed herein generally relate to a slit valve door assembly for sealing an opening in a chamber. A slit valve door that is pressed against the chamber to seal the slit valve opening moves with the chamber as the slit valve opening shrinks so that an o-ring pressed between the slit valve door and the chamber may move with the slit valve door and the chamber. Thus, less rubbing of the o-ring against the chamber may occur. With less rubbing, fewer particles may be generated and the o-ring lifetime may be extended. With a longer lifetime for the o-ring, substrate throughput may be increased.

In one embodiment, a slit valve door includes a door body having a first body, a second body, and a third body. The second body and third body each may be coupled to the first body at an edge thereof and spaced apart from the first body in a center area thereof. The slit valve door may also include one or more bellows coupled between the first body and at least one of the second body and the third body so that the distance between a seal on the second body and a seal on the third body can vary with any variation in the width of the slit valve door.

In another embodiment, a slit valve door includes a first body, a second body spaced from the first body and a first bellows coupled between the second body and first surface of the first body. The slit valve door may also include a second bellows coupled between the second body and second, third, fourth, and fifth surfaces of the first body such that an air pocket is present between the first body, the second body, the first bellows, and the second bellows.

In another embodiment, a load lock chamber includes a load lock chamber body. At least one opening may be formed through a surface of the load lock chamber body. The load lock chamber may also include a slit valve door. The slit valve door may include a door body having a first body, a second body, and a third body. The second body and the third body each may be coupled to the first body at an edge thereof and spaced apart from the first body in a center area thereof. The slit valve door may also include one or more bellows coupled between the first body and at least one of the second body and the third body, and a slit valve door actuator coupled with the slit valve door and the chamber body.

In another embodiment, a load lock chamber includes a load lock chamber body having at least one opening formed through a surface of the load lock chamber body. The load lock chamber also includes a slit valve door. The slit valve door includes a first body having a second surface, third surface, fourth surface, fifth surface, sixth surface, and seventh surface. The slit valve door also includes a second body spaced from the first body and a first bellows coupled between the second body and the seventh surface. The slit valve door also includes a second bellows coupled between the second body and second, third, fourth, and fifth surfaces of the load lock chamber body such that an air pocket is present between the first body, the second body, the first bellows, and the second bellows. The load lock chamber may also include a slit valve door actuator coupled with the slit valve door and the chamber body.

In another embodiment, a slit valve door is disclosed. The slit valve door includes a first body and a second body coupled to the first body at an edge thereof and spaced from the first body such that a first slit is present between the first body and the second body. The slit valve door also includes a first bearing plate coupled between the first body and the second body, a first bellows coupled between the first body and the second body and over the first slit and a first clamp coupled to the first bellows, the first body and the second body.

In another embodiment, a method of evacuating a chamber is disclosed. The method includes compressing an o-ring between a slit valve door and a chamber body, the slit valve door having a first portion and a second portion, drawing a vacuum within the chamber body and moving the chamber body, the o-ring and the first portion relative to the second portion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2F are schematic cross sectional views of slit valve doors that may be used to deflect with the chamber body when the chamber body deflects under vacuum.

FIGS. 3A and 3B are isometric views of a slit valve door according to one embodiment.

FIG. 3C is a schematic cross sectional view of a slit valve door 350.

FIG. 4A is a front view of a slit valve door prior to evacuating a chamber.

FIG. 4B is a front view or another slit valve door prior to evacuating the chamber.

FIG. 4C is a cross sectional view of an apparatus having two separate volumes prior to evacuating one of the volumes.

FIG. 4D is a front view of a slit valve door that has been coupled to an evacuated chamber.

FIGS. 5A-5C are cross sectional views of a slit valve door according to one embodiment.

FIGS. 5D and 5E are isometric views of a slit valve door according to another embodiment.

FIGS. 5F-5J are isometric views of a slit valve door according to another embodiment.

FIG. 6A is an isometric view of a slit valve door according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a slit valve door assembly for sealing an opening in a chamber. A slit valve door that is pressed against the chamber to seal the slit valve opening moves with the chamber as the slit valve opening shrinks so that an o-ring pressed between the slit valve door and the chamber may move with the slit valve door and the chamber. Thus, less rubbing of the o-ring against the chamber may occur. With less rubbing, fewer particles may be generated and the o-ring lifetime may be extended. With a longer lifetime for the o-ring, substrate throughput may be increased.

One of the major problems in load lock doors is the relative movement of the sealing surface of the load lock in relation to the door. The mating surface is the load lock chamber that goes through vacuum cycling that leads to a considerable movement. Because the door is fairly rigid and uncompromising, and because the o-ring is subjected to a significant abrasion/erosion mechanism, a lot of particles can be generated that leads to the seal to be compromised in a short period of time. The embodiments discussed herein provide for the flexibility of the o-ring groove area of the door that mates with the moving part so that the relative movement is minimized. The flexibility is achieved by providing two long slots through the length of the door and then covering the slot with a flexible sealing gasket (such as a diaphragm) to maintain vacuum integrity. In order to maintain the door's mechanical integrity, the flexible area may be coupled to the rigid part of the door through a series of pins and bushings that allows vertical movement and limits lateral movement.

The embodiments described herein will be described below in regards to a triple slot load lock chamber available from AKT America, Inc., a subsidiary of Applied Materials, Inc., Santa Clara, Calif. While the embodiments will be described below in regards to a load lock chamber, it is to be understood that the embodiments may be practiced in other vacuum chambers including those produced by other manufacturers.

Figure 1A:
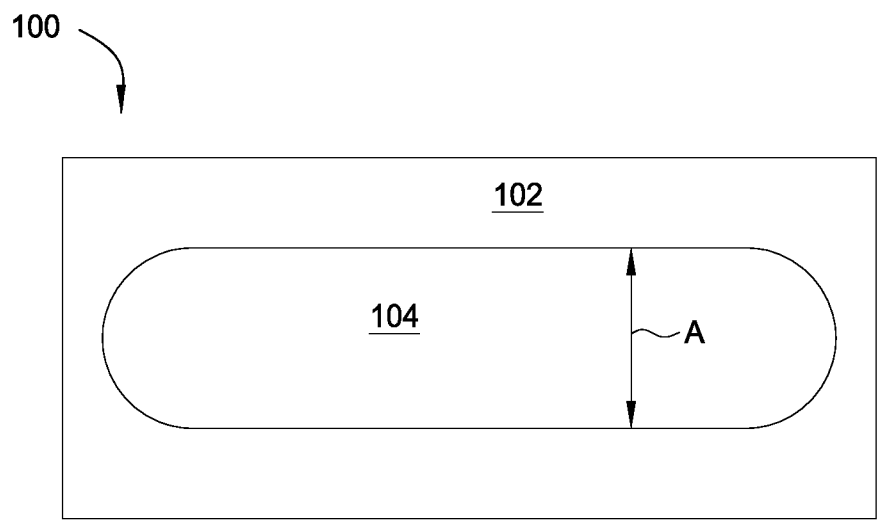
FIG. 1A is a schematic front view of a chamber 100 prior to evacuation with a slit valve door removed.

FIG. 1A is a schematic front view of a chamber 100 prior to evacuation with a slit valve door removed. The chamber 100 may be a load lock chamber, a processing chamber or any general chamber that may be evacuated. The chamber 100 includes a chamber body 102 having a slit valve opening 104 through one or more walls of the chamber body 102. The slit valve opening 104 has a height shown by arrows "A". However, when the chamber 100 is evacuated, the slit valve opening 104 may shrink.

Figure 1B:
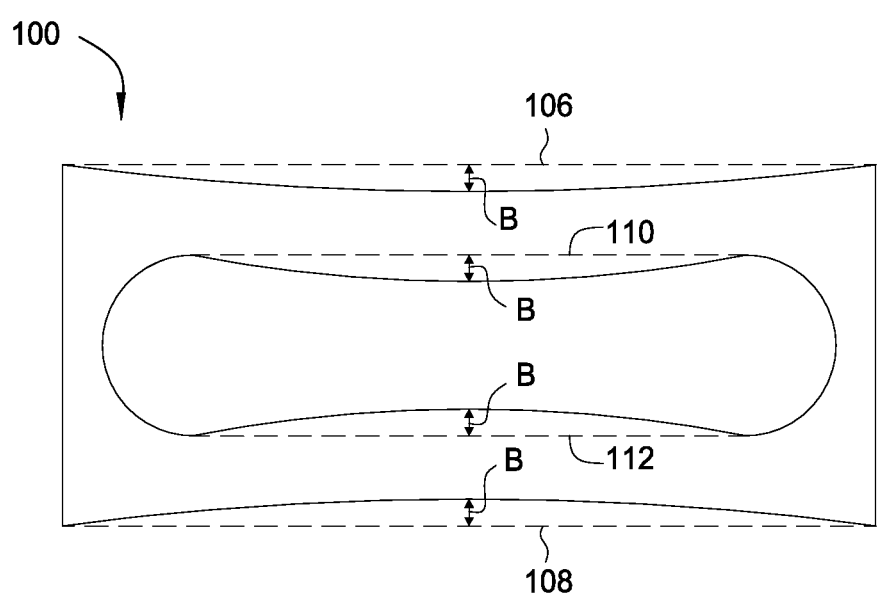
FIG. 1B is a schematic front view of the chamber 100 of FIG. 1A under vacuum with the slit valve door removed.

FIG. 1B is a schematic front view of the chamber 100 of FIG. 1A under vacuum with the slit valve door removed. As shown, the slit valve opening 104 has pinched in the middle because the chamber body 102 has moved from the normal position shown by lines 106, 108, 112, 110 a distance shown by arrows "B". The chamber body 102 pinches in more in the center of the slit valve opening 104 because there is no support in the center area of the slit valve opening 104 when the chamber body 102 deflects under vacuum. For large area chambers, such as chamber sized to process substrates having an area of greater than about 1 square meter, the deflection may be quite pronounced. Because the chamber moves, the slit valve door (not shown), may rub against the chamber body 102 and generate particles if the slit valve door does not move.

FIGS. 2A-2F are schematic cross sectional views of slit valve doors that may be used to deflect with the chamber body when the chamber body deflects under vacuum. In the embodiment shown in FIG. 2A, the slit valve door 200 may be actuated by rotating the rotating handle 208 about its axis of rotation. The rotating handle 208 may be coupled with the central body 202 of the slit valve door 200 by a coupling handle 210.

The slit valve door 200 comprises a first body 202, a second body 204, and a third body 206. In one embodiment, the first body 202 and the second and third bodies 204, 206 comprise separate pieces coupled together at the ends thereof and spaced apart at a center area thereof. In another embodiment, the first body 202 and the second and third bodies 204, 206 comprise a unitary piece of material spaced apart at a center area thereof. A rod 214 may be coupled between each of the second and third bodies 204, 206 and the first body 202. A cap portion 218 may be present on the second and third bodies 204, 206 over the rod 214 if desired. The rod 214 may be fixedly coupled to the first body 202, but slidably coupled to the second and third bodies 204, 206 such that the rod 214 remains stationary relative to the second and third bodies 204, 206 when the second and third bodies 204, 206 move relative to the first body 202. The second and third bodies 204, 206, may slide and move relative to the first body 202 such that the second and third bodies 204, 206 move closer to the first body 202 when a vacuum is drawn in the chamber. The second and third bodies 204, 206 may slide because the O-ring 220 that is coupled thereto is pressed against the chamber wall to seal the chamber. When the chamber moves or deflects relative to its normal position, so will the O-ring 220 and hence, the second and third bodies 204, 206 that are coupled to the chamber wall. Thus, while the rod 214 remains stationary, the second and third bodies 204, 206 slide and move relative to the first body 202 and closer or further away from the first body 202. FIG. 2A shows the slit valve door 200 where the second and third bodies 204, 206 have been compressed closer to the first body 202. FIG. 2D shows the slit valve door 200 where the second and third bodies 204, 206 are not compressed closer to the third body 202. A bushing 216 may be present between the second and third bodies 204, 206 and the rod 214 to permit the second and third bodies 204, 206 to move with as little friction as possible. In one embodiment, the bushing 216 may comprise polytetrafluoro ethylene. The rods 214 may be spaced along the slit valve door 200. In one embodiment, the first body 202, the second and third bodies 204, 206, the rod 214, and the cap 218 each comprise a metal material. In another embodiment, the first body 202, the second and third bodies 204, 206, the rod 214, and the cap 218 comprise aluminum.

To ensure that the slit valve door 200 is able to seal the processing chamber, bellows 212 may be present on the side of the slit valve door 200 that will face the vacuum environment. The bellows 212 may compress as the second and third bodies 204, 206 move closer to the first body 202. Similarly, the bellows 212 may expand as the second and third bodies 204, 206 move farther away from the first body 202. The bellows 212 may be a vacuum bellows capable of maintaining a vacuum such that the vacuum environment is not compromised by the bellows 212. The bellows 212 on the vacuum side isolate the rods 214 and the bushing 216 from the vacuum environment and thus, any particles generated by the bushing 216 and rods 214 rubbing may be prevented from reaching the vacuum environment and potentially contaminating the substrates.

During operation, the slit valve door 200 is rotated into place relative to the chamber whereby the O-ring 220 is brought into contact with the vacuum chamber. The vacuum is then drawn in the vacuum chamber. As the vacuum is drawn, the O-ring 220 and hence, the second and third bodies 204, 206 move with the vacuum chamber body relative to the first body. In so moving, the second and third bodies 204, 206 may move relative to the first body 202 and the rod 214. Additionally, the bellows 212 compress. Thus, the second and third bodies 204, 206, the bushing 216, and the cap portion 218 all move relative to the first body 202. When the vacuum chamber is vented, the second and third bodies 204, 206 again move relative to the first body 202 and the rod 214. However, during venting, the second and third bodies 204, 206, the bushing 216, and the cap portion 218 all move away from the first body 202 and the rod 214. Additionally, the bellows 212 expands. Thereafter, the slit valve door 200 may be moved away from the vacuum chamber. In the embodiment shown in FIG. 2B, a bellows 232, 234 is present on both the vacuum side and the other side of the slit valve door 230. FIG. 2B shows the slit valve door 230 where the second and third bodies have been compressed closer to the first body. FIG. 2E shows the slit valve door 230 where the end pieces are not compressed closer to the first body.

In FIG. 2C, the slit valve door 250, the first body 252 is spaced from the second and third bodies 254, 256 by an air gap 264 that is bound by a bellows 258, 260 on both sides of the slit valve door 250. The air that is present in the air gap 264 vents out of the air gap 264 through a filter 262 when the second and third bodies 254, 256 compress towards the first piece 252. Similarly the filter 262 permits air to enter the air gap 264 when the second and third bodies 254, 256 expand away from the first piece 252. FIG. 2C shows the slit valve door 250 where the second and third bodies 254, 256 have been compressed closer to the first body 252. FIG. 2F shows the slit valve door 250 where the second and third bodies 254, 256 are not compressed closer to the first body 252.

FIGS. 3A-3B are isometric views of a slit valve door 300 according to one embodiment. The slit valve door 300 is coupled to a shaft 302 and a support/mount 304. The shaft 302 rotates about its axis of rotation to pivot the slit valve door 300. The coupling handle is coupled to the shaft 302 and the first body 306 of the slit valve. Thus, when the second and third bodies 308, 310 compress towards and expand away from the first body 306, the support/mount 304 remains stationary with the center body 306. The second and third bodies 308, 310 are coupled to the first body 306 at the edges 312, 314 such that the first body 306 and the second and third bodies 308, 310 comprise a single, unitary piece of material. In one embodiment the single, unitary piece of material comprises aluminum. The second and third bodies 308, 310 may be spaced from the first body 306 by spaces 316, 318 in the areas of the second and third bodies 308, 310 that may compress and/or expand relative to the first body 306 during evacuation and venting. There are several rod 318 locations along the slit valve door 300.

FIG. 3C is a schematic cross sectional view of a slit valve door 350 having top and bottom slots 352 to permit portions of the slit valve door 350 to move with the chamber body when the chamber body deflects. A bellows 354 may be placed over the slots 352 and held in place by a clamp 356. The clamp 356 and bellows 354 may either face into or away from the interior of the chamber.

Figure 4E:
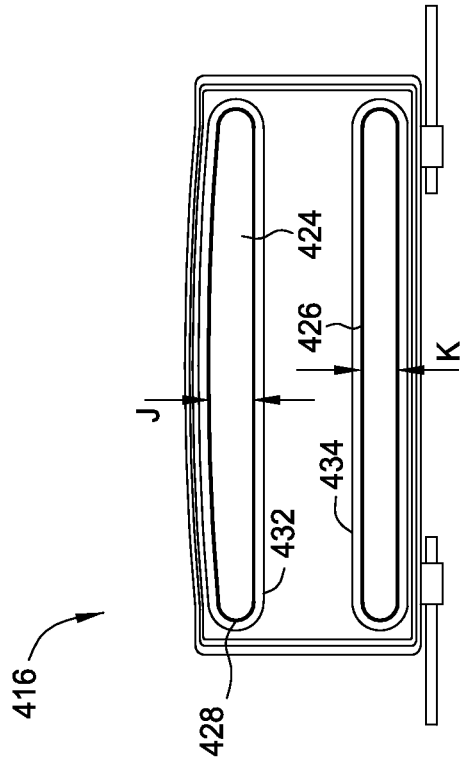
FIG. 4E is a front view of a slit valve door that has been coupled to a chamber adjacent to an evacuated chamber.
Figure 4F:
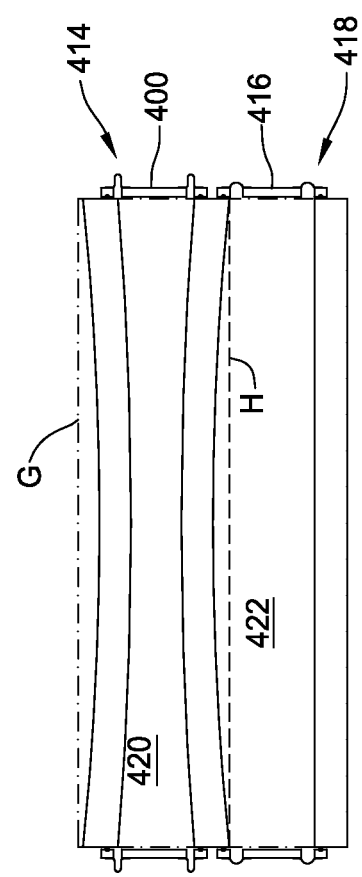
FIG. 4F is a schematic cross sectional view of a chamber showing an evacuated chamber volume adjacent an atmospheric chamber volume.

FIG. 4A is a front view of a slit valve door 400 prior to evacuating a chamber. FIG. 4B is a front view of a slit valve door 416 prior to evacuating a chamber. FIG. 4C is a cross sectional view of a load lock chamber 404 having two separate, environmentally isolated volumes 420, 422 prior to evacuating the load lock apparatus 404. FIG. 4D is a front view of the slit valve door 400 that has been coupled to an evacuated chamber volume 420. FIG. 4E is a front view of the slit valve door 416 that has been coupled to a chamber volume 422 adjacent the evacuated chamber volume 420. FIG. 4F is a cross sectional view of the apparatus 404 after evacuating volume 420. As shown in FIG. 4A, the gaps 402 between the center piece and the end pieces (i.e., the pieces spaced from the center piece) are shown by arrow "E". The gaps 402 create a substantially uniform distance between the end pieces and the center piece for the entire gap 402. Prior to evacuation, the bellows 414 for the door 400 are in an intermediate position. Similarly, the bellows 418 for the doors 416 that seal volume 422 are also at an intermediate position.

The slit valve door 416 shown in FIG. 4B is similar to the slit valve door 400 shown in FIG. 4A. The gaps 424, 426 between the end pieces and the center piece are shown by arrow "I". The gaps 424, 426 create a substantially uniform distance between the end pieces and the center piece for the entirety of the gaps 424, 426.

When the slit valve door 400 is coupled to the apparatus 404 and the volume 420 evacuated, the walls 406, 408 of the load lock chamber 404 compress in from their normal positions shown by lines "G", "H", and cause the gap 402 of the slit valve door 400 to compress as shown by arrow "F" such that the distance between the end pieces and the center piece gradually decreases from the edge 410 of the gap 402 to the center 412 of the gap 402. The bellows 414 of the door 400 compress as shown in FIG. 4F. Because the wall 408 deflects toward the evacuated volume 420, the door 416 expands the thus expands the bellows 418 to a stretched state shown in FIG. 4E.

For the atmospheric volume 422, the slit valve door 416 expands and thus stretches the bellows 418 for the top gap 424 as shown by arrows "J" while the bottom gap 426 remains relatively unchanged as shown by arrows "K". However, the gap 426 may stretch as much as gap 424. In one embodiment, the gap 426 may stretch less than gap 424. In one embodiment, the gap 426 remains unchanged such that the gap 426 is separated by a distance represented by arrows "K" that substantially equals the distance represented by arrows "I". Gap 424 expands because it is directly adjacent to the deflected chamber wall while the gap 426 is directly adjacent to a wall that may not deflect. The expansion or compression of the gaps 402, 424, 426 means that the end pieces are moving relative to the central piece. Similarly, O-rings 428, 430, 432, 434 move relative to the central piece. The O-rings 428, 430, 432, 434 are shaped substantially identical to the gaps 402, 424, 426, but are slightly larger. Thus, the O-rings 428, 430, 432, 434 shape mimics the shape of the gaps 402, 424, 426. The area of the gaps 402, 424, 426 where the most movement occurs will also be the area of the O-rings 428, 430, 432, 434 that have the most movement relative to the central piece. The O-rings 428, 430, 432, 434 move with the deflecting chamber walls and the moving portions of the slit valve doors 400, 416 such that the O-rings 428, 430, 432, 434 do not move relative to the deflecting chamber walls or the portions of the slit valve doors 400, 416 that move. Hence, the locations of the gaps 402, 424, 426 where the least amount of movement or no movement occurs will experience the least amount of movement or no movement for the O-rings 428, 430, 432, 434. Put another way, the long side of the O-rings 428, 430, 432, 434 will move while the short side of the O-rings 428, 430, 432, 434 will move little or not at all.

Figure 5H:
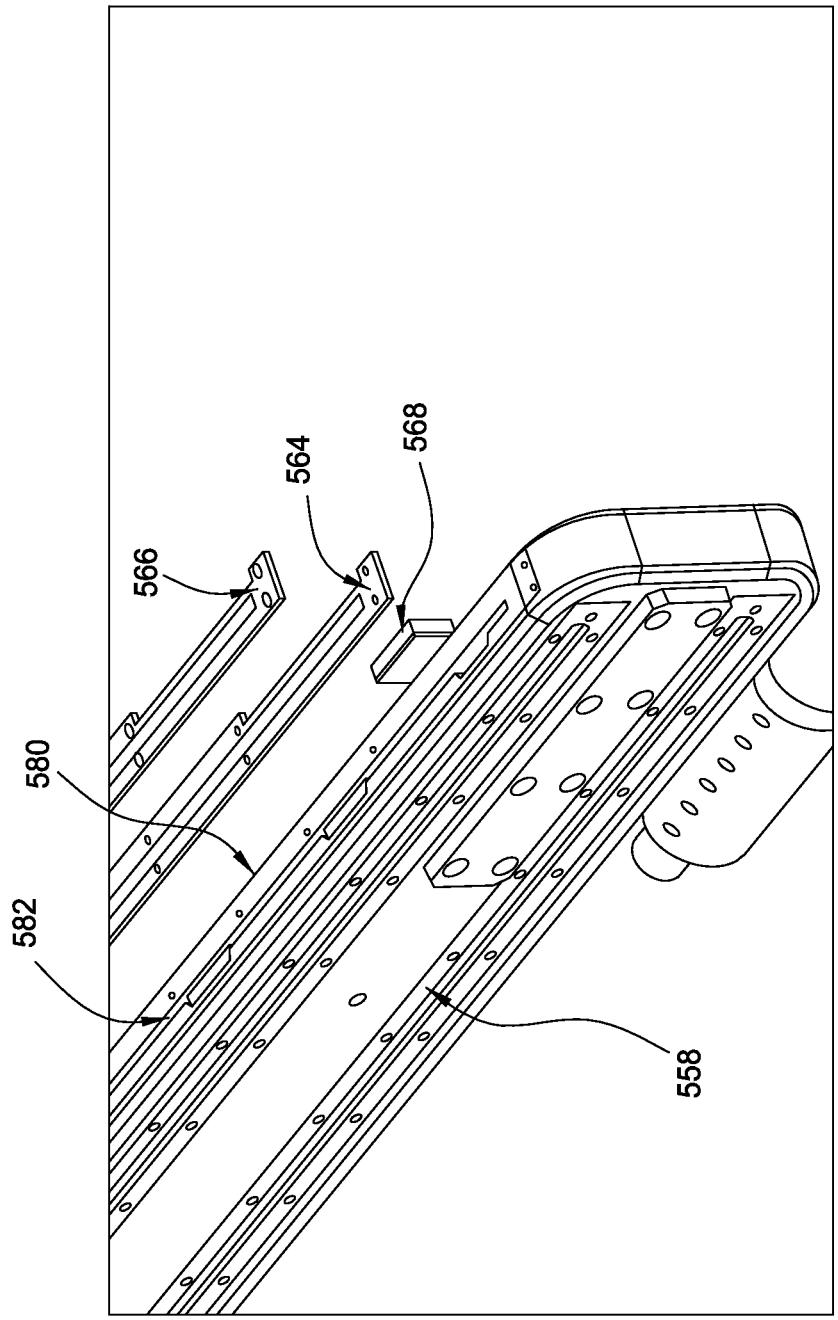
Figure 5J:
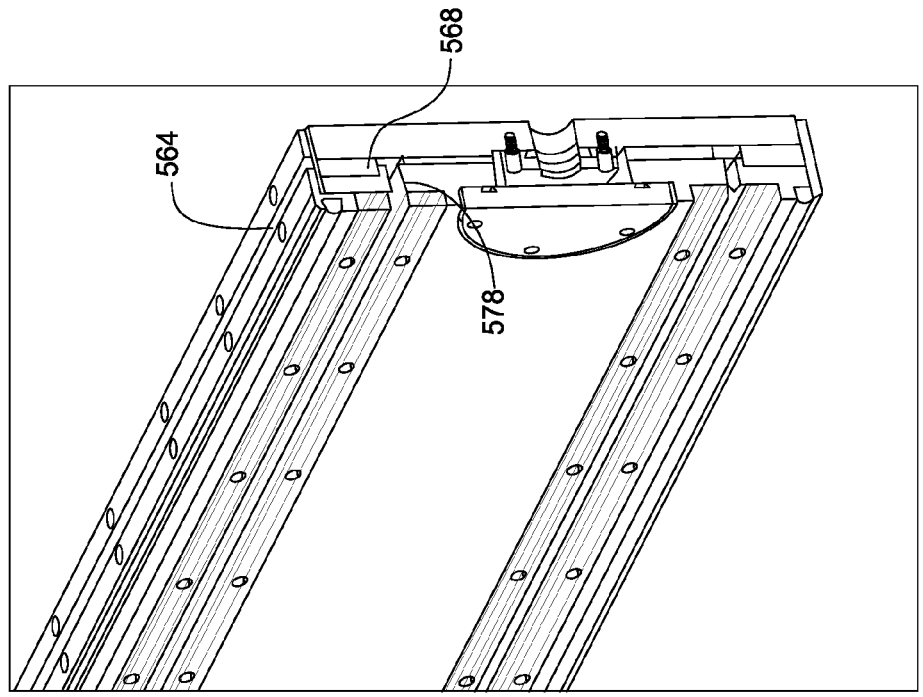
Figure 5I:
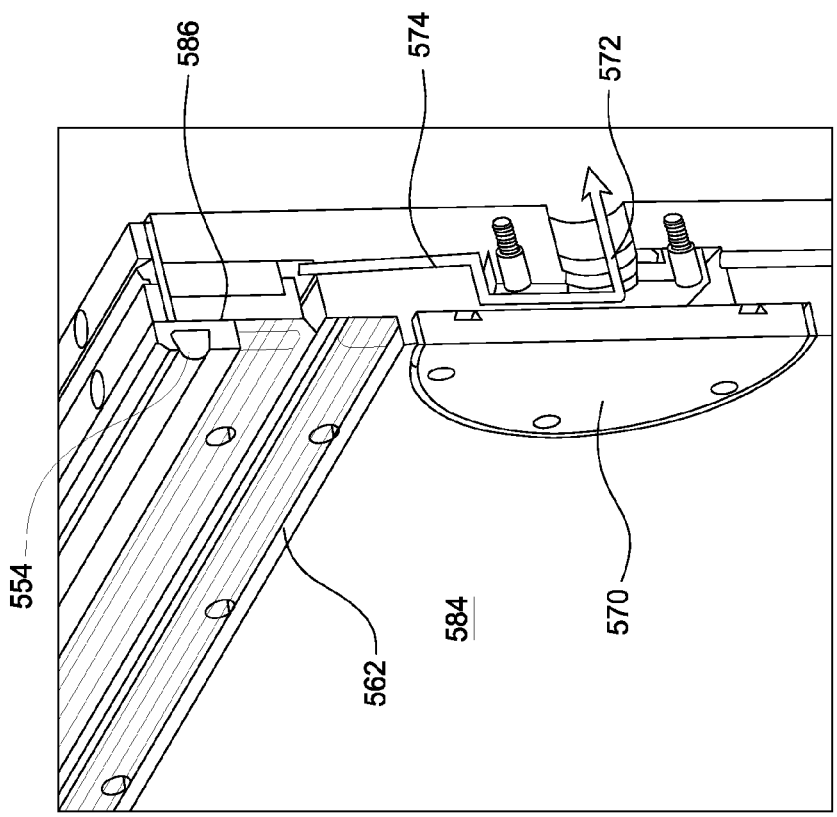

FIGS. 5A-5C are cross sectional views of a slit valve door 500 according to one embodiment. The slit valve door 500 may comprise a first body 502 and a second body 504. An O-ring 506 may be coupled with the second body 504 to permit the slit valve door 500 to seal to a chamber. The second body 504 may comprise a separate piece from the first body 502 that is movable relative to the first body 502. When pressed against a chamber, the second body 504 may move with the chamber and relative to the first body 502. Thus, the O-ring 506 may remain stationary relative to the chamber (but move relative to the first body) and no parts of the slit valve door 500 and the chamber rub against each other. Due to the movement of the second body 504 with the chamber, the amount of particles generated that may contaminate the substrate may be reduced.

The second body 504 may slide along a bearing 514 positioned between the second body 504 and the first body 502. In one embodiment, the bearing 514 may comprise poly ether ether ketone. In another embodiment, the bearing 514 may comprise polytetrafluoro ethylene.

The moving second body 504, because it moves relative to the first body 502, may produce particles that could contaminate a substrate. Thus, the locations of the slit valve door 500 where any particles may be generated due to moving parts may be sealed from exposure to the substrates and the vacuum environment. One such area where particles may be generated is the interface between the second body 504 and the bearing 514. The particles formed may fall into the cavity 518 between the second body 504 and the first body 502. Thus, a bellows 510 may be fastened to a surface of the second body 504 as well as the first body 502 to isolate the cavity 518 from the sealing side of the slit valve door 500. The bellows 510 may be coupled to the second body 504 and the first body 502 by one or more fastening mechanisms 516.

To provide additional coupling of the second body 504 to the first body 502, a second bellows 508 may be coupled between another surface of the second body 504 and the first body 502 along the top of the slit valve door 500. The surface of the second body 504 where the second bellows 508 is coupled is substantially perpendicular to the surface of the second body 504 where the first bellows 510 is coupled. One or more fastening mechanisms 512 may be used to couple the bellows 508 to the first body 502 and the second body 504.

The cavity 518 may be maintained at approximately the same pressure as the pressure side of the slit valve door 500. In one embodiment, the pressure of the pressure side of the slit valve door 500 may be atmospheric pressure. By maintaining the cavity 518 at approximately the same pressure as the pressure side of the slit valve door 500, the second body 504 may maintain its position relative to the first body 502 even when the chamber to which the slit valve door 500 is sealed is vented or evacuated. The predominate force on the second body 504 may be from the O-ring 506 contact with its sealing surface on the chamber. To achieve the equal pressure condition, the top bellows 508 may comprise a fine porosity material. In one embodiment, the porosity may be about 1 micrometer. The porosity may permit the cavity 518 to breathe while containing any particles generated by the moving parts. In one embodiment, the top bellows 508 may comprise solid elastomer, but breathable filter plugs may connect into the cavity 518 from the pressure side.

FIG. 5B shows the fastening mechanism 520 that couples the second body 504 to the first body 502 through the bearing 514. The fastening mechanism 520 may be disposed in a slot 522 formed in the second body 504. When the chamber is evacuated and the corner piece moves, the fastening mechanism 520 remains stationary relative to the second body 504 and the slot 522 moves relative to the fastening mechanism 520. FIG. 5C shows the second body 504 in a displaced condition. As shown, the slot 522 is moved relative to the fastening mechanism 520.

FIGS. 5D and 5E are isometric views of a slit valve door 530 according to one embodiment. FIG. 5D shows the non-sealing side of the slit valve door 530 with where the shaft 532 and support/mount 534 are located. The slit valve door 530 may rotate about the shaft 532 to position the slit valve door 530 against and away from the chamber. The support/mount 534 couples the shaft 532 to the first body 536.

FIG. 5E shows the sealing side of the slit valve door 530. As shown, the second body 538 may span a considerable length of a side of the first body 536. It is to be understood that the second body 538 could span the entire side of the first body 536. Additionally, the second body 538 could span the areas where the slit valve door 530 is expected to move when the chamber moves. As can be seen from FIG. 5E, the O-ring 540 traverses both the second bodies 538 and the first body 536. In the situation where the second body 538 spans less than the entire length of a side of the first body 536, additional bellows may be necessary at the vertical interfaces of the second bodies 538 and first body 536 respectively. In one embodiment, the bellows for the vertical interfaces are unitary with the bellows.

FIGS. 5F-5J are isometric views of a slit valve door 550 according to another embodiment. The slit valve door 550 may rotate or pivot about a rod 552 to compress an O-ring 554 against a sealing surface. The slit valve door 550 includes a door body 576 having two substantially parallel slits 578 formed therein to permit movement of portions of the slit valve door 550 when the chamber to which the slit valve door 550 is sealed against move. In one embodiment, the slits 578 on the surface facing the inside of the chamber are covered with a bellows 558, 560 which is held in place by a clamp 556, 562. Similar to the bellows discussed above, the bellows 558, 560 prevent particles that may be generated from movement of the slit valve door 550 from entering the processing area and contaminating the substrate.

The top surface 580 of the slit valve body may also have a bellows 564 covered by a clamp 566 to hold bearing plates 568 within the slot 582 between moving surfaces. The bearing plates 568 may have a thickness that changes from the edge to the center of the bearing plate 568 to make an arc shape. When the slit valve door 550 is sealed to the chamber, the second body 586 moves relative to the first body 584 and moves along the bearing plate 568. The second body 586 is coupled to the first body 584 at the edge thereof. The first body 584 has a cover 570 for covering a centering ring with porous media 572 that permits air or gas to enter or leave the path 574 where the particles may be generated. The particles will be trapped inside the cavity and the pressure inside cavity can be kept the same as the pressure side of door. This is one example of a breathable filter plug discussed above.

Figure 6B:
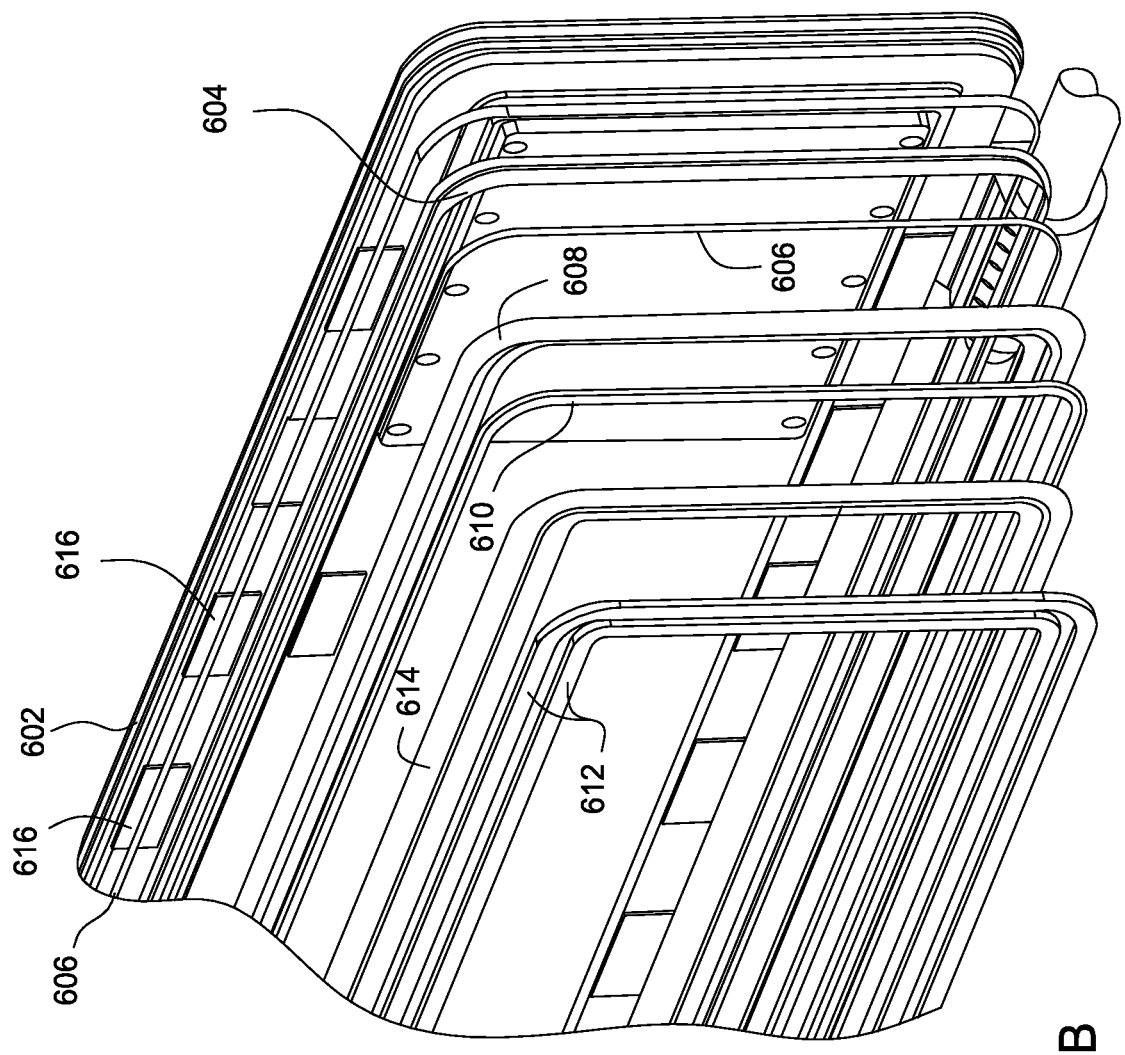
FIG. 6B is a blown up view of the slit valve door of FIG. 6A.

FIG. 6A is an isometric view of a slit valve door 600 according to one embodiment. FIG. 6B is a blown up view of the slit valve door 600 of FIG. 6A. The slit valve door 600 comprises a first body 602, seal caps 606 for coupling a bellows 604 between the second body 608 and the first body 602, an O-ring 610 for sealing the slit valve door 600 to the chamber, seal caps 612 for coupling a bellows between the first body 602 and the second body 608, and slide pads 616 for permitting the second body 608 to move relative to the first body 602 when the chamber is evacuated. In one embodiment, the slide pads 616 may comprise poly ether ether ketone. In another embodiment, the slide pads 616 may comprise polytetrafluoro ethylene. One or more slide pads may be spaced between the first body 602 and the second body 608.

Figure 7:
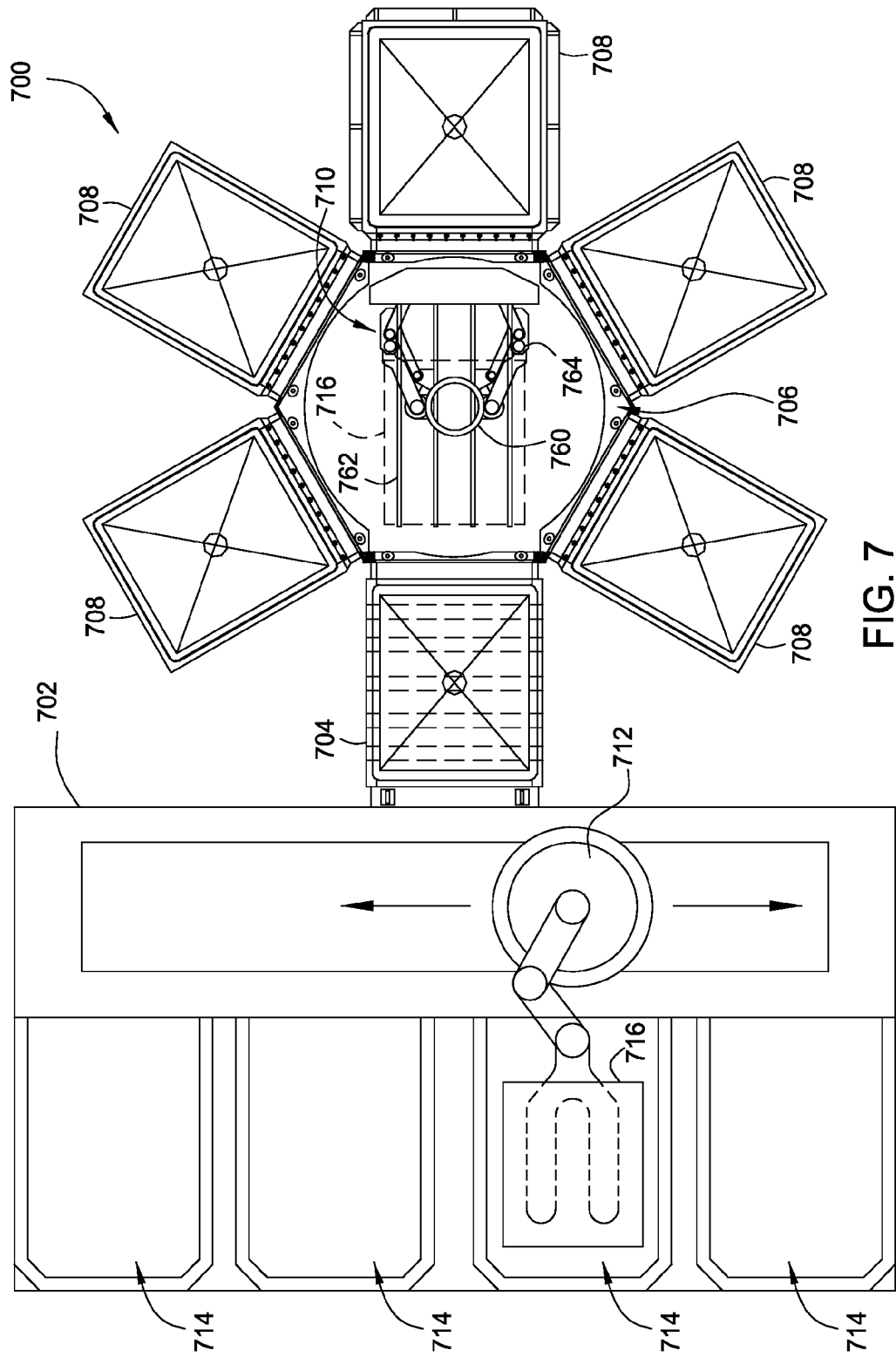
FIG. 7 is a schematic top view of a cluster tool according to one embodiment.

FIG. 7 is a plan view of an illustrative processing system 700, such as a linear or cluster tool, having one embodiment of a vacuum transfer chamber 706, one or more load lock chambers 704 and a plurality of processing chambers 708. A factory interface 702 coupled by the load lock chamber 704 to the transfer chamber 706 and includes a plurality of substrate storage cassettes 714 and an atmospheric robot 712. The atmospheric robot 712 facilitates transfer of substrates 716 between the cassettes 714 and the load lock chamber 704.

The substrate processing chambers 708 are coupled to the transfer chamber 706. The substrate processing chambers 708 may be configured to perform at least one of a chemical vapor deposition process, a physical vapor deposition process, an etch process or other large area substrate manufacturing process suitable for fabricating a flat panel display, solar cell or other device. Generally, large area substrates have a plan area of at least 1 square meter, and may be comprised of a glass or polymer sheet.

The load lock chamber 704 generally includes at least one environmentally-isolatable cavity having one or more substrate storage slots defined therein. In some embodiments, a plurality of environmentally-isolatable cavities may be provided, each having one or more substrate storage slots defined therein. The load lock chamber 704 is operated to transfer substrates 716 between an ambient or atmospheric environment of the factory interface 702 and the vacuum environment maintained in the transfer chamber 706.

A vacuum robot 710 is disposed in the transfer chamber 706 to facilitate transfer of a substrate 716 between the load lock chamber 704 and the processing chambers 708. The vacuum robot 710 may be any robot suitable for transferring substrates under vacuum conditions. In the embodiment depicted in FIG. 7, the vacuum robot 710 is a polar or frog-leg robot that generally includes a robot base 760 which houses one or more motors (not shown) utilized to control the position of an end effector 762. The end effector 762 is coupled to the base 760 by a linkage 764. The load lock chamber doors discussed herein may be used to seal the load lock chamber 704 from the transfer chamber 710 and also from the factory interface 702.

It is to be understood that while the invention has been shown with vertically oriented slit valve doors, the invention is equally applicable to horizontally oriented doors that are substantially parallel to the ground when in their sealing position.

By permitting a portion of the slit valve door to move with the chamber as the chamber is evacuated and/or vented, the amount of particles generated between the slit valve door and the chamber may be reduced and thus, substrate contamination may be reduced.

While the foregoing is directed to embodiments of the present invention, other and further embodiments of the invention may be devised without departing from the basic scope thereof, and the scope thereof is determined by the claims that follow.

The invention claimed is:

1. A slit valve door, comprising:
a first body;
a second body coupled to the first body at an edge thereof and spaced from the first body such that a first slit is present between the first body and the second body;
a first bearing plate coupled between the first body and the second body;
a first bellows coupled between the first body and the second body and over the first slit;
a first clamp coupled to the first bellows, the first body and the second body,
a third body coupled to the first body at an edge thereof and spaced from the first body such that a second slit is present between the first body and the third body;
a second bearing plate coupled between the first body and the third body;
a second bellows coupled between the first body and the third body and over the second slit; and
a second clamp coupled to the second bellows, the first body and the third body.

2. The slit valve door of claim 1, further comprising:
a third bellows coupled between the first body and the second body and over a third slit that is substantially perpendicular to the first slit and formed in the top surface of the slit valve door; and
a third clamp coupled to the third bellows, the first body and the second body.

3. The slit valve door of claim 2, further comprising:
a fourth bellows coupled between the first body and the third body and over a fourth slit that is substantially perpendicular to the second slit and formed in the bottom surface of the slit valve door; and
a fourth clamp coupled to the fourth bellows, the first body and the third body.

4. The slit valve door of claim 3, wherein the first bearing plate and the second bearing plate each comprise a material selected from the group consisting of poly ether ether ketone and poly tetrafluoro ethylene.

5. The slit valve door of claim 4, wherein the first body has an opening therein that extends to the first slit and the second slit.

6. The slit valve door of claim 5, further comprising an O-ring coupled to the first body, the second body and the third body.

* * * * *